United States Patent [19]

Frosien

[11] 4,152,599
[45] May 1, 1979

[54] METHOD FOR POSITIONING A WORKPIECE RELATIVE TO A SCANNING FIELD OR A MASK IN A CHARGED-PARTICLE BEAM APPARATUS

[75] Inventor: Jürgen Frosien, Berlin, Fed. Rep. of Germany

[73] Assignee: Siemens Aktiengesellschaft, Munich, Fed. Rep. of Germany

[21] Appl. No.: 868,756

[22] Filed: Jan. 12, 1978

[30] Foreign Application Priority Data

Jan. 20, 1977 [DE] Fed. Rep. of Germany ....... 2702448

[51] Int. Cl.² ............................................ A61K 27/02
[52] U.S. Cl. ............................ 250/492 R; 250/492 A
[58] Field of Search .............. 250/311, 492 R, 492 A, 250/491

[56] References Cited

U.S. PATENT DOCUMENTS

| | | | |
|---|---|---|---|
| 3,519,788 | 7/1970 | Hatzakis | 250/492 A |
| 4,091,374 | 5/1978 | Muller et al. | 250/311 |

Primary Examiner—Harold A. Dixon
Attorney, Agent, or Firm—Kenyon & Kenyon, Reilly, Carr & Chapin

[57] ABSTRACT

An improved method for positioning a workpiece having at least one marking in a charged-particle beam apparatus relative to either a scanning field or a mask and in which a scanning beam linearly scans the workpiece and a signal is generated by the scanning and controls a writing beam which travels across the screen of a display means. The improvement of the invention comprises the step of scanning the workpiece with the scanning beam successively in opposite directions at the same velocity. The writing beam travels across the screen of the display means in response to the scanning in the same direction once for each scan of the workpiece by the scanning beam in a definite phase relationship to the scanning beam. The scanning of the workpiece generates two signals in response thereto and the positions of the two signals, which are displayed on the display means, are adjusted so that the signals are brought into coincidence.

4 Claims, 10 Drawing Figures

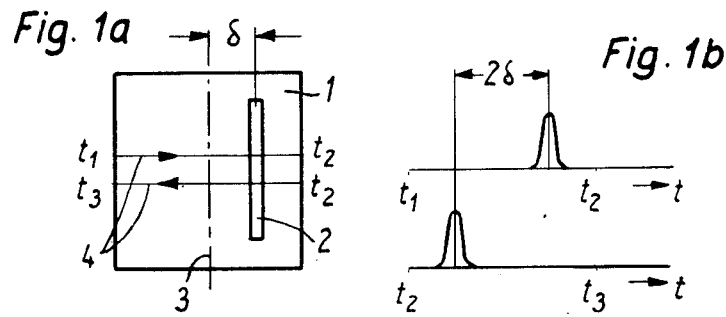
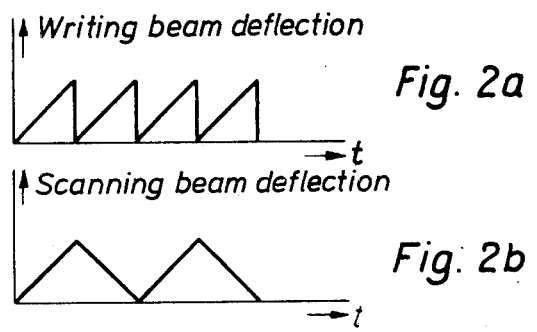
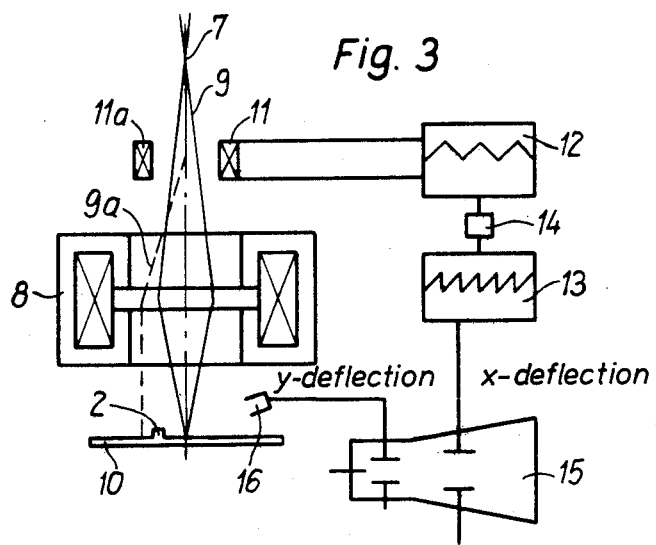
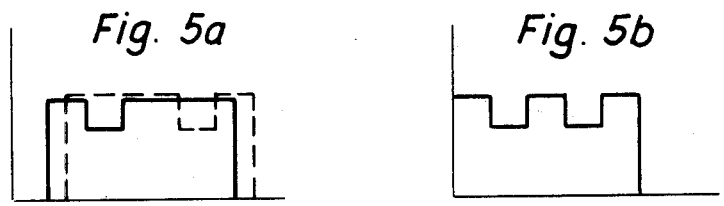

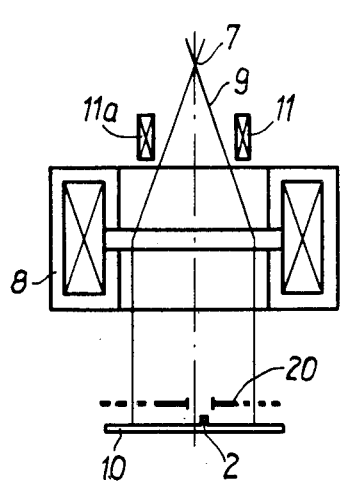
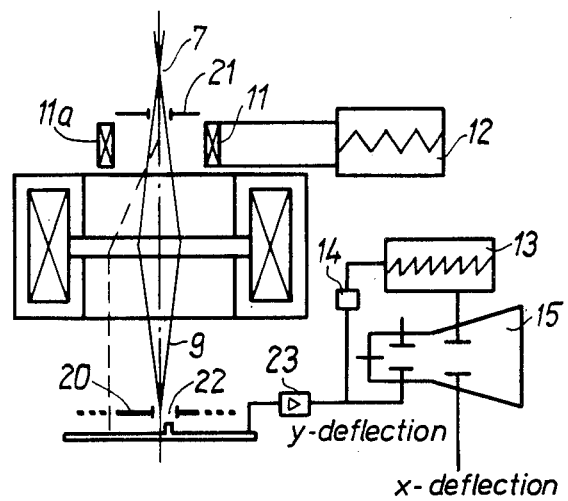
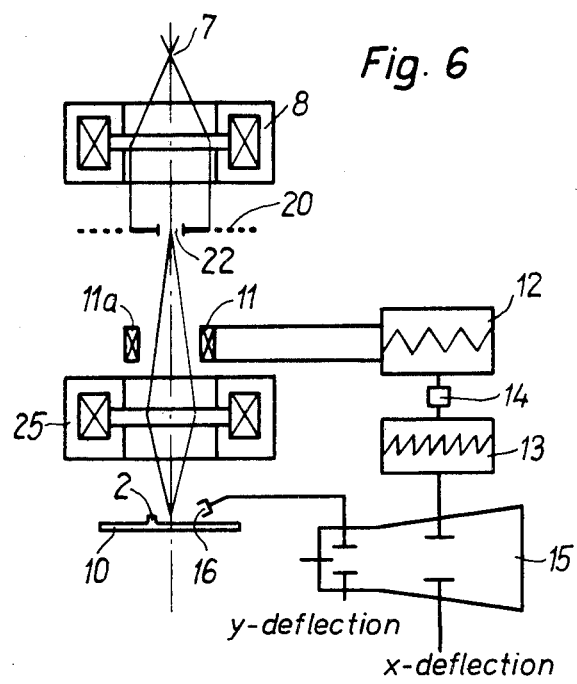

METHOD FOR POSITIONING A WORKPIECE RELATIVE TO A SCANNING FIELD OR A MASK IN A CHARGED-PARTICLE BEAM APPARATUS

BACKGROUND OF THE INVENTION

1. Field of the Invention

This invention relates to a method for positioning a workpiece having at least one marking, in particular a wafer for highly integrated circuits, which is to be positioned in a charged-particle beam apparatus relative to a scanning field or a mask and in which a scanning beam scans the workpiece line by line and a signal generated by the scanning controls a writing beam which is caused to travel over the screen of a display apparatus.

2. Description of the Prior Art

In manufacturing highly integrated (LSI) circuits on a wafer, the separate areas which are to be differently doped, and the conductors connecting these areas, must be fabricated in several sequential process steps. Between each of these steps, the wafer surface is covered with photoresist varnish and the varnish film covering the wafer is exposed in selected areas to either light or electrons. The latter method (exposure to electrons) is particularly important if with progressing miniaturization of the integrated circuits, the resolution limit for light is exceeded. Regardless the method used to expose the photoresist layer on the wafer, however, the process must be repeated several times during the manufacturing process.

It is absolutely necessary to position the wafer each time one of the process steps is carried out to the same position with an accuracy which corresponds at least to the smallest spacing between the individual elements of the circuits, i.e., the capacitors, transistors, resistors, etc. of the circuits. Such positioning is achieved as follows utilizing a raster method:

The workpiece, for example, a wafer, to be aligned is scanned line by line (by either analog or digital methods) by a fine scanning beam, for example, a focused electron beam. In analog scanning, the deflection signal for deflecting the scanning beam is varied continuously. In digital scanning, the deflection signal is varied stepwise and has a staircase-shaped waveform. This type of deflection is used when the scanning is controlled, for example, by a computer. A writing beam is deflected on a display apparatus in synchronism with the scanning beam and its intensity is controlled by a signal generated by the scanning beam on the workpiece. This signal may be generated in response to the detection of backscattered electrons, secondary electrons, X-rays, or the specimen (workpiece) current. The scanning enables an image of the workpiece to be constructed point by point on the display apparatus. Alignment of the workpiece relative to markings applied to it on the display apparatus is achieved by using imaged markings or by computer-controlled comparison of the actual-value and reference-value positions.

A modified positioning method is known for use in an electron-beam projection apparatus. In this method, a mask having the desired structure is reduction imaged by electron-beam optics on the workpiece. See J. Vac. Sci. Technol., Vol. 12, No. 6 (1975), pages 1135 to 1140, and U.S. Pat. No. 3,876,883. To effect positioning, the illumination ray path is changed so that a fine electron beam is produced in the region of the mask and the workpiece. The signals emanating from the workpiece surface produce two superimposed images which are displayed on a display apparatus. One of these images is the sharp reproduction of the surface of the workpiece with alignment markings. The other image is a shadow image of the mask which is generated by suppressing electron rays in the mask plane by using the mask itself. The position of these two images enables the workpiece to be aligned relative to the mask.

In another known method, only an intensity profile along individual raster lines (line scan) is produced transversely through the markings on the workpiece and no complete image of the workpiece surface is recorded. This method is described in *IEEE Transactions on Electron Devices,* Vol EB-17, No. 6 (June, 1970), pages 450 through 457. The position of the marking signal relative to the raster field enables the deviation from a reference position, for example, the center of the raster field, to be determined. This can be achieved, for example, by comparison with markings on the display apparatus, or by counting the steps of the signal waveform generated when digital raster scanning is used. Using this positioning method, the alignment is achieved in only one direction at first. To complete alignment of the workpiece, the process must be repeated for the other directions. The position of a single point, for example, the maximum of the intensity distribution or the edge of a marking is almost only utilized to determine the deviation from the reference position. In the case of poorly made or damaged masks, this can cause considerable error. The latter error can be corrected, at least partially, by repeating the measurements at different points of the marking and then averaging these measurements. The disadvantage of this, however, is that it substantially increases the effort involved in making the measurement.

SUMMARY OF THE INVENTION

It is therefore an object of the present invention to provide an improved method for positioning a workpiece in a charged-particle beam apparatus which provides increased measuring accuracy without increasing the effort involved in making the measurement.

This and other objects of the invention are achieved in a method for positioning a workpiece having at least one marking in a charged-particle beam apparatus relative to either a scanning field or a mask and in which a scanning beam linearly scans the workpiece and a signal is generated by the scanning and controls a writing beam which travels across the screen of a display means. The improvement comprises the steps of scanning the workpiece with the scanning beam successively in opposite directions at the same velocity. The writing beam travels across the screen of the display means in response to the scanning in the same direction, once for each scan of the workpiece by the scanning beam in a definite phase relationship to the scanning beam. The scanning generates two signals in response to the scanning of the workpiece, and the positions of the two signals generated in response to the scanning of the workpiece which are displayed on the display means are adjusted so that the signals are brought into coincidence.

Contrary to known raster positioning methods, the method of the invention does not deflect the scanning and the writing beams in the same direction, for example, by a sawtooth-shaped deflection signal, as has been customary heretofore, but instead uses a triangular-shaped deflection signal to deflect the scanning beam, the decreasing flank of which has the same length and the same (but negative) slope as the increasing flank. The inventive method uses a sawtooth deflection signal to deflect the writing beam, as in previous methods.

Since the writing beam travels across the display apparatus once for each scan of the workpiece by the scanning beam in each direction, the sawtooth deflection signal which deflects the writing beam must be generated at a frequency which is at least twice that of the triangular-shaped deflection signal used to deflect the scanning beam. This deflection causes the scanning beam to sweep back and forth over the workpiece, while the writing beam is deflected in only one direction on the display apparatus. As a result, the marking signal is generated on the display apparatus alternately first from left to right and then from right to left. This increases the measurement accuracy, since the deviation of the mark from its reference position by a distance δ is indicated by a separation of the two images by a distance which is proportional to 2δ.

An additional advantage is the independence of the positioning accuracy from phase shifts of the signal in the detection electronics. If a two-dimensional surface region is scanned on the workpiece in this manner, two images of the marking are obtained on the display apparatus when the writing beam is brightened by the signal generated by this marking. For line scan, only two bright dots are obtained, or, for markings which are extended in the line direction, two bright lines, which correspond to a cross-section through the images of the marking, are obtained. In this situation, in which the scanning beam scans the workpiece along a single raster line, the improvement of the invention further comprises the signal generated by the raster line scanning deflecting the writing beam in a direction perpendicular to the direction of travel of the writing beam across the screen of the display means a distance which is proportional to the magnitude of the signal generated. The writing beam travels across the screen of the display means along a single raster line, and the two signals generated by the scanning of the workpiece and displayed on the display means are brought into coincidence by shifting the workpiece in a direction parallel to the line scanned by the scanning beam.

This type of display increases the accuracy of the measurement and corresponds to a mirror reflection of the signal waveform at the central perpendicular of the scanned line. If the position of the marking is asymmetrical to the center of the raster area, two marking signal waveforms are generated which are separated by a distance proportional to twice the magnitude of the deviation of the marking from the center of the raster area. Exact positioning, i.e., alignment of the marking with the raster area center, is achieved if both marking signal waveforms coincide. The center of the raster area need not be absolutely identical with the center of the workpiece. This would be necessary only when the entire workpiece is scanned. It is preferable, however, to apply the marking near the edge of the workpiece and to scan only a small area around the marking, since rough positioning is achieved by mounting the workpiece. Exact positioning then means that the marking lies in the center of the scanned area. This positioning enables high accuracy to be achieved since two images, i.e., the marking signal waveforms, of the beam scans in both directions are brought into coincidence and not only the position of single points are determined as in the known method previously described.

Since the signal distribution is mirrored by the mirror reflection of the scanning field, the right half of the marking signal is brought into coincidence with the left half. To achieve maximum positioning accuracy, it is, therefore, advantageous if the marking has a symmetrical signal waveform. While disturbances of such a symmetrical signal waveform, which may be caused, for example, by damage to the mask, the external dimensions of which are not changed in the scan line direction, can be recognized in the waveform of the marking signal, they do not have as great an effect on the measurement accuracy as in known methods since two complete images are brought into coincidence. Even if this is not possible in some areas due to the disturbances, there are always enough undisturbed remaining areas at which coincidence can be controlled without difficulty. It is also an advantage of the inventive method in line scan operation that point probes are not absolutely necessary for scanning. In theory, probes having any shape could be used, but a symmetrical intensity distribution parallel to the scanning direction should be available to the extent possible for the reasons mentioned above.

Until the present, it has alway been assumed that the scanning beam sweeps back and forth over the workpiece, while the writing beam is deflected on the display apparatus only in one direction with at least twice the frequency of the workpiece scanning. Deflection of the scanning and the writing beams theoretically can also be achieved inversely without changing the theory itself, i.e., two marking signals are also generated in that case if the position of the marking is asymmetric. The advantage of independence versus phase shifts in the signal is, however, lost. If the workpiece is to be aligned relative to a raster field, the fixed phase relationship between the scanning and the writing beams can be achieved if the writing beam is triggered by the scanning beam. If the workpiece is to be aligned relative to a mask, the fixed phase relationship can most easily be achieved if the writing beam is triggered by a signal generated on the workpiece. This can be achieved in the most advantageous way by deriving the sawtooth deflection signal for the writing beam from the increasing flank of the scanning beam signal for one sweep and from the decreasing flank of the scanning beam signal for the following sweep. Another way to establish the phase relationship is to trigger the scanning and the writing beams using a common source.

These and other objects of the present invention will be described in greater detail in the following detailed description.

BRIEF DESCRIPTION OF THE DRAWINGS

In the drawings, wherein similar reference numerals denote similar elements throughout the several views thereof:

FIGS. 1a and 1b are graphical illustrations of the time cycles of the scanning beam and the corresponding signal waveform of the writing beam of a charged-particle beam apparatus operated in accordance with the method of the invention;

FIGS. 2a and 2b are graphical illustrations of the writing beam deflection signal and the scanning beam deflection signal, respectively, of a charged-particle beam apparatus operated in accordance with the improved method of the invention;

FIG. 3 is a schematic illustration of a charged-particle beam apparatus which can be used to implement one embodiment of the improved method of the invention;

FIGS. 4a and 4b are schematic illustrations of a charged-particle beam apparatus which can be used for implementing another embodiment of the improved method of the invention;

FIGS. 5a and 5b are graphical illustrations of the signals generated by the scanning beam of the apparatus illustrated in FIGS. 4a and 4b; and FIG. 6 is a schematic illustration of another charged-particle beam apparatus which can be used to implement a further embodiment of the improved method of the invention.

DETAILED DESCRIPTION

Referring now to the drawings, a raster field 1 is shown in FIG. 1a in which a marking 2 having a rectangular shape is located. This marking is positioned to the right of the center of raster field 1, which is identified by the dashed line 3, and is spaced apart from the center by a distance $\delta$. The scanning beam 4, which starts at time $t_1$ at the left-hand edge of raster field 1, is swept over the raster field until the time $t_2$, and has returned to its starting point at time $t_3$ along the same path. For the purpose of clarity, the forward and reverse sweeps of the scanning beam are shown vertically separated in FIG. 1a.

The corresponding waveform of the writing beam is plotted in FIG. 1b. As shown in this figure, the writing beam is deflected at exactly twice the frequency of that of the scanning beam. In the upper portion of FIG. 1b, the signal plotted is the one obtained during the forward sweep of scanning beam 4. The signal obtained during the return sweep of the beam is plotted in the lower portion of FIG. 1b. Both signals have the shape of a bell curve, which can be explained by the fact that the scanning beam, i.e., the probe, is not a point but occupies an area with a beam intensity that decreases toward the outside. The spacing of the two signals is exactly $2\delta$, corresponding to twice the distance of the marking 2 from the center of raster field 1. The two sweeps of the writing beam across the display apparatus have also been illustrated vertically spaced-apart in FIG. 1b for better presentation. In actuality, the time axes coincide. If either the workpiece with marking 2 or raster field 1 is displaced so that the marking lies on center line 3 of raster field 1, the two signals obtained during the forward and return sweeps of the writing beam will coincide. Positioning in this direction is thereby achieved.

FIGS. 2a and 2b illustrate the waveforms of the writing and scanning beam deflections corresponding to the scanning described with reference to FIGS. 1a and 1b. As can be seen, the writing beam is deflected in sawtooth fashion at twice the frequency of the triangular-shaped scanning beam deflection signal. In addition, the deflection of both beams begins at the same instant in time, whereby their phase relationship is fixed. The deflection signals for the scanning and writing beams may also be varied stepwise and have a staircaseshaped waveform without changing the theory of the positioning method.

FIG. 3 shows the positioning of a workpiece, for example, a wafer 10, relative to a raster field in an electron beam writer. The electron beam writer, which is shown schematically in its simplest form, consists of an electron source 7, for example, a thermal cathode or a field emission cathode, and a lens 8 (practically realized as a lens system) which is excited so that the electron beam 9 emanating from the electron source 7 is focused on wafer 10. The wafer has a marking 2 and the electron beam can be swept over the wafer in one direction by means of deflection coils 11 and 11a. It should be noted that an electrostatic deflection system may also be used instead of deflection coils 11 and 11a. Dashed line 9a represents, for example, a deflected central ray. For deflection in other directions, other deflection coils (not shown) are required.

A triangular-shaped deflection signal is transmitted to deflection coils 11 and 11a by a deflection generator 12, whereby the scanning electron beam is swept over the surface of wafer 10 successively in opposite directions at the same velocity. A trigger 14 is provided so that the sawtooth deflection signal of an additional deflection generator 13, which is applied to the x-deflection coils of a television monitor 15 serving as the display apparatus, is generated at exactly twice the frequency of the triangular-shaped deflection signal and so that both signals begin at the same instant in time. The positioning signals can be any signals generated by the electron beam, such as secondary electrons, backscatter electrons, luminescence radiation, X-ray quanta, or the sample (specimen) current. In the illustrated apparatus, a detector 16 is disposed above wafer 10 which registers, for example, the secondary electrons. The output signal generated by detector 16 is transmitted to the y-deflection coil of television monitor 15. If electron beam 9 is now swept across wafer 10 in the manner indicated, a y-signal is obtained at the corresponding x location on the display apparatus 15 each time the beam sweeps over marking 2.

In the present case, it is assumed that the deflection signal of deflection generator 12 deflects the electron beam over the entire length of the wafer 10 and that the center of the deflection area coincides with the optical axis of the apparatus. In this special case, the correct positioning of the wafer 10 can be achieved when the undeflected electron beam 9 strikes the marking 2. It is also possible, of course, to shift the center of the scanning area by means of a constant deflection signal which is superimposed on the triangular deflection signal. In addition, the size of the deflectionn area can be varied by changing the amplitude of the deflection signal. In the apparatus illustrated, the positioning is carried out in only one direction. To position the wafer 10 completely, it is, of course, necessary to perform at least two further similar positioning operations.

FIG. 4a and 4b illustrate the positioning method of the invention for an electron beam shadow projector in which the wafer is to be aligned relative to a mask. The shadow projector includes an electron source 7 which is imaged at infinity by the lens 8. Structures of a projection mask 20, which is disposed directly above the wafer 10, are thereby projected onto the wafer by a parallel bundle of electrons. (see FIG. 4a.) To align the wafer relative to the mask, the illumination ray path is changed over, for example, as described in U.S. Pat. No. 3,876,883, so that a fine electron beam 9 is produced in the region of the wafer and the mask. Such a ray path is shown in FIG. 4b. A diaphragm 21 located below the electron source 7 screens out a relatively narrow bundle from the electron beam 9 in order to permit better focusing.

With the fine electron beam 9 generated as a probe in this manner, the positioning procedure is carried out in a manner similar to that already described with reference to the electron beam writer. This particular method differs from the former, however, in that an artificial raster field, the position of which automatically includes the position of the mask 20, is generated by an aperture in mask 20 which represents a mask marking 22. In order to obtain a mirror reflection of this artifical raster field at its central perpendicular, the writing beam is triggered by the increase in intensity of the positioning signal released by the scanning beam on the wafer at the respective edge of mask marking 22. The specimen (workpiece) current functions as the positioning signal in this embodiment and is applied, by means of an amplifier 23, to the y-deflection coil of the television monitor 15 used as the display apparatus. The sawtooth deflection signal of deflection generator 13 is transmitted to the x-deflection coil of the television monitor 15. The deflection generator 13 is addressed in this embodiment by the positioning signal generated by the trigger 14.

The signal waveform displayed on the television monitor 15 is shown in FIG. 5a without triggering by the positioning signal and in FIG. 5b with triggering by the positioning signal. It is assumed that the marking 2 on the wafer 10 is not located in the center of the raster area and that the specimen current decreases when the electron beam strikes the marking. The triangular-shaped deflection signal of deflection generator 12 sweeps the electron beam over the mask by exciting the coils 11 and 11a. The deflection of the beam must be chosen so that it is at least large enough to cover the entire mask marking 22.

During the forward sweep from left to right, for example, the electron beam arrives at the left edge of mask marking 22 at a given instant in time, and a first positioning signal is generated. If the electron beam is swept over the marking 2 on its forward sweep, a smaller positioning signal is first generated in this region and later the normal one is generated. If the electron beam reaches the right-hand edge of mask marking 22, it is blanked out and the positioning signal disappears. The electron beam continues to sweep in the same direction for a time, is then reversed and the process is repeated. However, since the distances through which the electron beam travels on the right and left sides of the mask marking 22 outside the area of the mask marking need not be equal (or, expressed differently, the mask marking 22 is not in the center of the scanned area), the image of the marking appears on the television monitor 15 in different places. By means of the described triggering (shown in FIG. 5b), the mask marking 22 is positioned in the same position for the forward and return sweeps of the electron beam.

Since in this embodiment of the electron beam shadow projector the phase relationship between the scanning and the writing beam is established by the positioning signal, it is unnecessary that the frequency of the sawtooth deflection signal for the writing beam be exactly twice the frequency of the triangular-shaped deflection signal for the scanning beam. The frequency must be at least twice as great, but can also be higher in special cases. It is only necessary to assure that the scanning beam sweeps over the entire mask marking 22 in the time interval of each writing beam sweep.

FIG. 6 illustrates the positioning method of the invention in a reducing electron beam projector. Similar to the electron beam shadow projector shown in FIG. 4b, the wafer 10 is to be aligned in this case relative to a mask 20. An optical imaging system 25 is disposed in this projector, however, between the mask 20 and the wafer 10. Wafer 10 is aligned relative to mask 20, as in the case of the electron beam writer described with reference to FIG. 3, but a point scanning probe is not used in this projector. Instead, a probe formed by the mask marking 22 is used. Instead of a single mask marking 22, several mask markings can also be used simultaneously.

The embodiments of the positioning method of the invention have been described only for line scan operation. It should be noted, however, that the method is also applicable for all three different exposure possibilities shown in FIGS. 3, 4 and 6 for normal raster operation in which a two-dimensional surface area of the wafer containing the marking is scanned line by line. The signal emanating from the wafer keys on the brightness of the writing beam which travels across the display apparatus in raster-fashion. In the non-aligned case, two images of the marking are generated which must be brought into coincidence by translation and, if necessary, by rotation of the wafer.

In the embodiments of the method of the invention described, electron beams are used to achieve positioning of the workpiece. It should be noted, however, that other charged-article beams can be utilized. For example, the method of the invention is also suitable to effect positioning using light. In the latter case, deflection of the scanning beam is accomplished, for example, by a rotating mirror.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for positioning a workpiece having at least one marking in a charged-particle beam apparatus relative to either a scanning field or a mask and in which a scanning beam linearly scans the workpiece and a signal is generated by the scanning and controls a writing beam which travels across the screen of a display means, the improvement comprising the step of scanning said workpiece with said scanning beam successively in opposite directions at the same velocity, said writing beam traveling across the screen of said display means in response to said scanning in the same direction once for each scan of the workpiece by the scanning beam in a definite phase relationship to the scanning beam, said scanning generating two signals in response to said scanning of said workpiece, and adjusting the positions of the two signals generated in response to said scanning of said workpiece which are displayed on said display means so that said signals are brought into coincidence.

2. The method recited in claim 1, wherein said scanning beam scans said workpiece along a single raster line, and wherein the improvement further comprises said signal generated by said raster line scanning deflecting said writing beam in a direction perpendicular to the direction of travel of said writing beam across the screen of said display means a distance which is proportional to the magnitude of the signal generated, said writing beam travelling across said screen of said display means along a single raster line, said two signals generated by said scanning of said workpiece and displayed on said display means being brought into coincidence by shifting said workpiece in a direction parallel to the line scanned by said scanning beam.

3. The method recited in claim 1, wherein said writing beam is triggered by said scanning beam.

4. The method recited in claim 1, wherein said writing beam is triggered by a signal generated on said workpiece.

* * * * *